United States Patent
Oberhardt et al.

(10) Patent No.: US 6,849,910 B2
(45) Date of Patent: Feb. 1, 2005

(54) SYSTEMS AND METHODS FOR IMPROVING THE PERFORMANCE OF SENSING DEVICES USING OSCILLATORY DEVICES

(76) Inventors: Bruce J Oberhardt, 10,000 Grafton Rd., Raleigh, NC (US) 27615; Stephen W. Smith, 4816 Montvale Dr., Durham, NC (US) 27705; Jason Michael Zara, 504 Alma St. SE., Vienna, VA (US) 22180

(*) Notice: Subject to any disclaimer, the term of this patent is extended or adjusted under 35 U.S.C. 154(b) by 0 days.

(21) Appl. No.: 10/441,540

(22) Filed: May 20, 2003

(65) Prior Publication Data

US 2004/0021185 A1 Feb. 5, 2004

Related U.S. Application Data

(63) Continuation-in-part of application No. 10/396,133, filed on Mar. 25, 2003, application No. 10/441,540.
(60) Provisional application No. 60/369,306, filed on Apr. 1, 2002, and provisional application No. 60/381,953, filed on May 21, 2002.

(51) Int. Cl.[7] .................. H01L 27/14; H01L 29/82; H01L 29/84
(52) U.S. Cl. .................. 257/414; 257/419; 257/420
(58) Field of Search .................. 257/414, 415, 257/416, 417, 418, 419, 420, 254

(56) References Cited

U.S. PATENT DOCUMENTS

| 5,895,629 | A | * | 4/1999 | Russell et al. ............ 422/94 |
| 6,268,635 | B1 | * | 7/2001 | Wood ............ 257/415 |
| 6,562,182 | B2 | * | 5/2003 | Agarwal ............ 257/1 |
| 6,682,899 | B2 | * | 1/2004 | Bryan et al. ............ 435/7.1 |

* cited by examiner

*Primary Examiner*—Phuc T. Dang

(57) ABSTRACT

Microelectromechanical (MEMS) oscillatory devices are placed adjacent a face of a microelectronic sensor platform and configured to oscillate to improve transport to the sensor of substances to be detected. The MEMS oscillatory devices can be configured to oscillate to disrupt the boundary layer that is formed adjacent the face of the microelectronic sensor platform, which may improve sensor performance. MEMS oscillatory devices may be far less susceptible to wear and breakdown than MEMS rotary devices, such as fans.

3 Claims, 8 Drawing Sheets

FIG. 14D
FIG. 14E
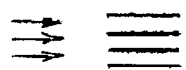
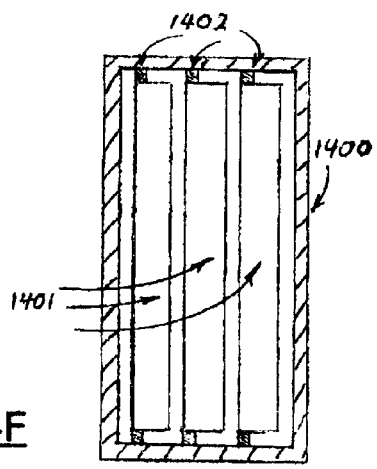
FIG. 14F
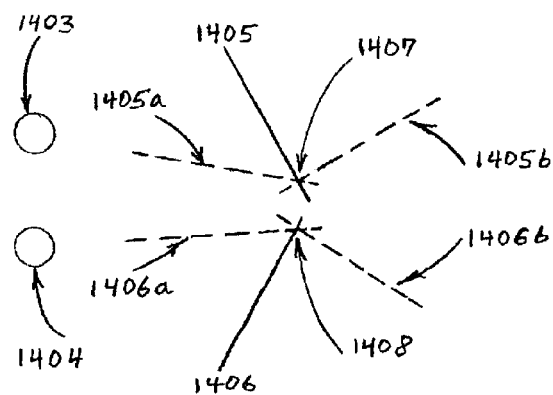
FIG. 14G
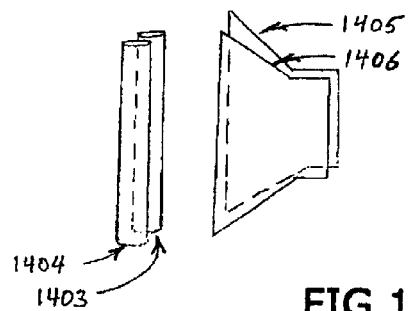
FIG. 14H

SYSTEMS AND METHODS FOR IMPROVING THE PERFORMANCE OF SENSING DEVICES USING OSCILLATORY DEVICES

CROSS-REFERENCE TO PROVISIONAL APPLICATION

This application is a CIP of Ser. No. 10/396,133 filed on Mar. 25, 2003 which claims benefit of 60/369,306 filed Apr. 1, 2002. This application Ser. No. 10/441,540 claims benefit of 60/381,953 filed May 21, 2002.

FIELD OF THE INVENTION

This invention relates to sensing devices and operating methods therewith, and more particularly to systems and methods for improvement of the performance of such sensing devices.

BACKGROUND OF THE INVENTION

Sensing devices are widely used in consumer, commercial, industrial, medical, environmental, and military applications. Sensors that detect molecules, that is biosensors and chemical sensors of various types, are gaining increasing importance in the sensor field. Sensors currently exist that detect volatile organic compounds in the air and can be used to differentiate odors. Other types of sensors, such as immunosensors, can detect certain small or large molecules with a high degree of specificity. Still others detect very large molecules, such as DNA or RNA. There exist yet other sensors that are useful in detection of biochemical surface markers on disease-causing bacteria or viruses. For some types of sensors, low sensitivity may not be a limiting problem, as it may have been in the past. Instead, the sensitivity of a particular sensor may be so great that a relatively small number of molecules may be detected if they enter the operating zone (detection area or "sweet spot") of the sensor.

Technologies are being developed with the potential to detect single molecules or individual molecular events. Such technologies may also be useful in detecting a single organism that may be harmful, such as: a bacterium, virus, or other pathogen, such as a prion. Detection of extremely low concentrations of toxic gas molecules in the air also may be achieved. However, if the concentration of the species to be detected (analyte) is very low, the probability of a single molecule entering the operating zone of the sensor would also be very low, and the arrival of analyte in a relatively tiny operating zone of a sensor might be a rare event. The probable time for the analyte in so low a concentration to migrate to the sensor operating zone could consequently be long or excessively long. Thus, the analyte would often not be detected quickly, if at all, even if the sensitivity of the sensor were more than adequate. For simplicity, analytes are often referred to herein as molecules or particles.

One solution to this problem of infrequent encounters between analyte and sensor is to increase the surface area of the sensor in contact with the milieu in which the analyte is to be detected. This approach has several distinct disadvantages. Typically, the cost of material of which sensors are made is high. Increasing the effective area of the operating zone may therefore be expensive. In addition, making the sensor much larger may often defeat its purpose. For example, it might no longer be sized appropriately for the application, as in an implantable device for human use or an unobtrusive detector for possible bioterrorism. Another solution to the problem is to concentrate the analyte prior to analysis. This approach may be less costly and may entail minimal increase in size of the overall system, however, the signal to noise ratio might not be improved if molecules in the milieu that interfere nonspecifically with detection of the analyte are concentrated along with the analyte.

SUMMARY OF THE INVENTION

The present invention teaches the use of microconvection to enhance sensor performance in a fluid (liquid or gas) medium. One strategy is to use a tiny rotary electric fan to direct flow to the sensor. The fan could be operated continuously or intermittently. A variety of other fanning devices may be used in conjunction with an appropriate sensor. In particular, the present invention deals with fanning strategies using oscillatory devices and sensor deployment for enhanced performance. The sensor configuration may help also, as will be discussed. In addition, and as a practical alternative to a rotary fan, an oscillatory fanning device capable of simulating wing fanning motions of insects is a useful strategy for small systems containing sensors. In air and especially in aquatic environments, the motion of cilia can be simulated to move molecules or particulates to sensor operating zones. In addition, sensors may be situated on cilia-like structures or moving sections of a sensing system to provide greater exposure to molecules of interest in the milieu.

Microelectronic devices containing sensors or "sensor platforms" that detect or quantify substances according to some embodiments of the present invention comprise a microelectronic substrate or sensor face upon which one or more oscillatory devices is situated. The sensor element itself or the "operating zone" of the sensor may consist of only a small portion of the "sensor face". Another embodiment includes a conduit within which an oscillatory device or a plurality of such oscillatory devices are configured to oscillate such that flow is directed toward one or more sensors situated within the conduit or immediately outside of it. In a preferred embodiment, a microelectromechanical (MEMS) oscillatory device or devices would be employed. In other embodiments, the plurality of microelectromechanical oscillatory devices may be configured to oscillate in a direction that is parallel to the sensor face, in a direction that is orthogonal to the face and/or in a direction that is oblique to the face. The microelectromechanical oscillatory devices may be arranged on the sensor face in a regular array and/or in a random array. Other embodiments employ sensors built into or onto oscillatory devices, such that the oscillations enable the sensing elements to intercept more molecules per unit time than would be possible in the absence of such oscillatory movement.

Some embodiments of the present invention may stem from the recognition that it is also possible to increase the probability that the analyte will enter the operating zone of the sensor. This may be achieved by placing the sensor in a location where the milieu is flowing. Assuming that the flowing portion communicates fully with the rest of the milieu and that the milieu is generally well mixed, the frequency of appearance of analyte in the operating zone of the sensor will increase measurably and will also be representative of the concentration of analyte in the milieu, generally. Molecules arrive at the operating zone of the sensor primarily via diffusion, and particles suspended in the fluid find their way via Brownian motion. Diffusion and Brownian motion are slow processes. If the milieu is not moving substantially, strategies may be employed to cause flow or convection to move more molecules into the vicinity of the sensor.

Some embodiments of the present invention may stem from the recognition that there are many ways to achieve convection, but one very effective method is to borrow a trick from nature and provide microconvection in the vicinity of the sensor. Sudden or periodic increases of bulk flow near a sensor result in the movement of a greater number of molecules past a sensing surface per unit time, increasing the probability that a molecule will diffuse into the operating zone of the sensor and thus be detected. In addition, sudden increases in flow tend to replace a previous volume, from which molecules already may have diffused to the operating zone of the sensor. Many animals "sniff" to increase olfactory performance. Bloodhounds may do it, but so do many other animals. Some animals "sniff" by "fanning". These animals typically have olfactory hairs and use fanning to move more air (or water, depending upon the environment) through the sensory hairs. For example, silkworm moths move their wings in a figure-of-eight path to increase airflow to their olfactory antennae. Lobsters flick olfactory antennules bearing chemosensory hairs through the surrounding water to increase the flux of odor molecules and thus enhance chemoreception.

A fanning method is used by the silkworm moth (a non-flying species) male to detect pheremone released by the female. The male stands in a stationary position and flaps his wings creating increased airflow in the vicinity of his feathery olfactory antennae. It is estimated that a 560-fold enhancement of flow of pheremone to the sensing zone of the antennae occurs as a result of a 40 Hz wing beat frequency during fanning [as demonstrated by C. Loudon and M. A. R. Koehl in "*Sniffing by a Silkworm Moth: Wing Fanning Enhances Air Penetration Through And Pheromone Interception By Antennae*": The Journal of Experimental Biology, Volume 203, pp 2977–2990 (2000)].

Some embodiments of the present invention may stem from the recognition there is a stagnant layer of fluid (e.g. air) adjacent to the sensor face when a sensor is in operation and there is some fluid flowing past the sensor face. The fluid flow defines a boundary layer, sometimes referred to as the "viscous boundary layer" or velocity boundary layer, usually defined as having a velocity lower than the free stream velocity. In the art of sensing, there also may be a corresponding concentration boundary layer for a substance of interest, where the concentration of a substance is different than that in the free stream (i.e. milieu). Embodiments of the present invention can provide a plurality of microelectromechanical oscillatory devices that are configured to oscillate to disrupt the boundary layer so that at least some exchange of analyte molecules may be achieved via convection. Rotary microelectromechanical devices such as fans, which are susceptible to friction and wear, need not be used. Rather, microelectromechanical oscillatory devices, which may be far less susceptible to wear and breakdown may be used to oscillate to disrupt the boundary layer. In some embodiments, the microelectromechanical oscillatory devices are configured to extend adjacent and/or at least partially into the boundary layer and, in other embodiments, the plurality of microelectromechanical oscillatory devices are located within the boundary layer.

In some embodiments of the present invention, the plurality of microelectromechanical oscillatory devices comprise a plurality of blades and a plurality of microelectromechanical actuators, a respective one of which is configured to oscillate a respective one of the blades. In some embodiments, the blades extend along the face and the microelectromechanical actuators are configured to oscillate the blades in a direction that is parallel to the face. In other embodiments, the blades extend orthogonal and/or oblique to the sensor face and the microelectromechanical actuators are configured to oscillate the blades in the direction that is parallel to the sensor face. In yet other embodiments, the microelectromechanical actuators comprise conventional microelectromechanical integrated force arrays.

In other embodiments according to the present invention, the microelectromechanical oscillatory devices comprise a plurality of flaps and a plurality of microelectromechanical actuators, a respective one of which is configured to oscillate a respective one of the flaps. In some embodiments, the flaps extend along the sensor face and the microelectromechanical actuators are configured to oscillate the plurality of blades in the direction that is orthogonal to the face. In other embodiments, the microelectromechanical oscillators comprise a plurality of electrostatically actuated flaps. In other embodiments, the plurality of microelectromechanical flaps each comprises a strip including a fixed end and a free end that is opposite the fixed end. In some embodiments, the strip is configured to pivot about the fixed end in an oscillatory manner. In other embodiments, the strip is configured to bend in an oscillatory manner. In still other embodiments, the strip is configured to uncoil and recoil in an oscillatory manner.

In any of the above embodiments, the plurality of microelectromechanical oscillatory devices may be configured to oscillate in response to electrostatic, magnetic, piezoelectric, thermal, and/or other actuation forces. Also, in any of the above-described embodiments, the plurality of microelectromechanical oscillatory devices may be configured to oscillate at the same frequency and/or different frequencies. Also, any of the above-described embodiments may be used in a liquid and/or a gas ambient. Any of the above-described embodiments may be used adjacent or on multiple faces of the sensor.

Finally, although the above-described embodiments have been described in connection with microelectronic structures, analogous methods of providing microconvection to a sensor by providing a plurality of microelectromechanical oscillatory devices and/or by disrupting the boundary layer also may be provided. Analogous structures and methods for increasing analyte transport to and removing boundary layer from a variety of types of sensors also may be provided. For example, in place of a chemical sensor, a conventional smoke detector or an ionization detector may be utilized. Analogous structures and methods that use electromechanical devices and/or electromechanical oscillatory devices also may be provided. Fanning devices and methods that are configured to be coupled to chemical sensors and/or other sensing components also may be provided.

BRIEF DESCRIPTION OF THE DRAWINGS

FIGS. 14A–16H are views of sensors structured differently than conventional planar sensors according to still other embodiments of the present invention.

DETAILED DESCRIPTION

Figure 1A:
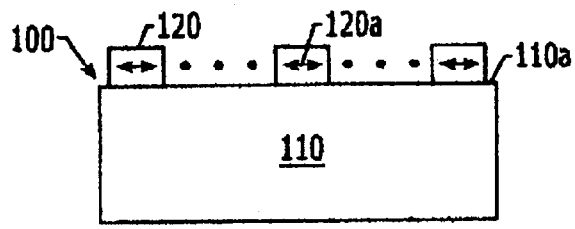
FIGS. 1A–1B are a side cross-sectional and a top plan view, respectively, of the active face or surface of a sensor platform with fanning components such as microelectronic devices according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the sensor platform, microelectromechanical system, or integrated circuit associated therewith than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 1B:
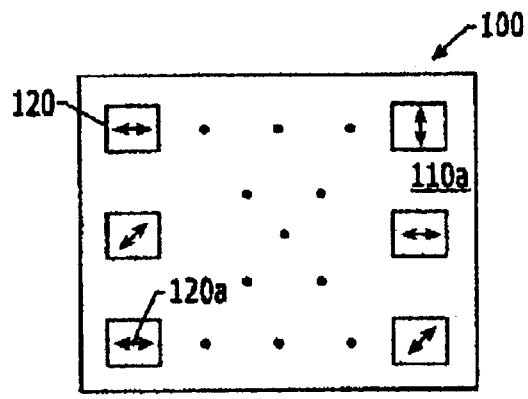

FIG. 1A is a side cross-sectional view and FIG. 1B is a top plan view of a surface or substrate or platform with sensor capability such as microelectronic sensors of one or more types according to some embodiments of the present invention. As shown in FIG. 1, the operating zones of these sensors (not shown) are situated on the surface of sensor platform 100. An "operating zone", which may also be referred to as a detection area or "sweet spot", is defined as that portion of a sensor that communicates with or contacts the milieu (also known as the "medium", "environment", or "sample") to be analyzed (or tested) and is in effect the area or volume in which analyte is either captured prior to detection or detected. Operating zones may be formed or patterned as discrete, independent, connected, or continuous regions on the face 110a. Sensor platform 100 includes a microelectronic substrate 110 including a face 110a. A plurality of microelectromechanical (MEMS) oscillatory devices 120 are adjacent the face 110a. As shown in embodiments of FIGS. 1A and 1B, these microelectromechanical oscillatory devices 120 are directly on the face 110a but not directly on a corresponding operating zone. By oscillatory, it is meant that the devices are configured to provide back and forth motion along a path, as opposed to rotary motion.

Still referring to FIGS. 1A and 1B, the microelectronic substrate 110 may be any conventional microelectronic substrate that is fabricated from elemental semiconductors such as silicon, compound semiconductors such as gallium arsenide and/or other non-semiconductor microelectronic substrates, and may include one or more conductive, semiconductive, insulating, mounting or other intermediary layers thereon, as well as chemical or biological reactive or affinity layers at or near the surface. A conventional encapsulating material, membrane, or porous layer also may be provided thereon. Accordingly, embodiments of the invention include bare substrates, often referred to as dies, and packaged substrates, often referred as chips. Additional layers may include layers consisting of conductive organic polymers, electrode material, covalently-bound enzymes, receptor molecules, and/or other analytical layers. The microelectronic substrate includes one or more electronic (such as discrete or integrated transistors or thyristors), MOSFET (metal oxide semiconductor field effect transistor), electro-optical (such as photodiode or charge coupled device), light source (such as a laser, light emitting diode, carbon nanotube or other light-emitting source or waveguide from an external source), chemoresistor (chemically-sensitive resistor), chemocapacitor (chemically-sensitive capacitor), electrode (or electrode array) and/or other device that generates an electromagnetic wave, magnetic, acoustic, vibrational, electrochemical, or other signal in response to an analyte during operation thereof. The face 110a may be defined by an outer surface of the substrate, including an outer surface of any layers on the substrate or of any elements attached to the substrate. It should be understood that the substrate may also contain microfluidic elements, manifolds, or circuits to transport reagents or analyte to or from operating zones on the face 110a.

Still continuing with the description of FIGS. 1A and 1B, the MEMS oscillatory devices 120 are of a microelectronic scale, and may be fabricated using conventional microelectronic processes such as deposition, etching, plating and/or the like. The design and fabrication of MEMS oscillatory devices are well known to those having skill in the art. Moreover, many different embodiments of MEMS oscillatory devices may be used, as will be described below.

Figure 1C:
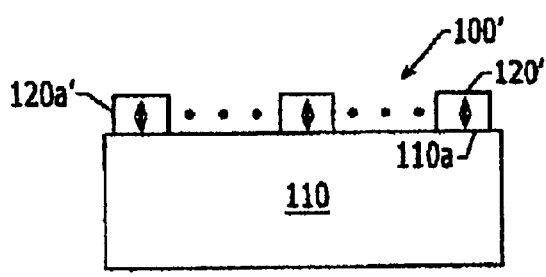
FIG. 1C is a side cross-sectional view of a sensor platform with MEMS fanning components such as microelectronic devices according to other embodiments of the present invention.

In embodiments shown in FIGS. 1A and 1B, the MEMS oscillatory devices 120 are configured to oscillate in a direction, shown by arrows 120a, that is parallel to the face 110a. In contrast, FIG. 1C illustrates other embodiments of the present invention wherein a microelectronic device 100' includes a plurality of MEMS oscillatory devices 120' that are configured to oscillate in a direction that is orthogonal to the face 110a, as shown by the arrows 120a'. It will also be understood that obliquely oscillating devices also may be provided.

Referring again to FIGS. 1A–1C, in some embodiments of the present invention, the MEMS oscillatory devices are arranged on the face in a regular array, for example in an array of equally spaced apart rows and columns. However, in other embodiments of the present invention, the MEMS oscillatory devices 120, 120' are arranged on the face in a random array, i.e., in an array of MEMS oscillatory devices that are not equally spaced apart. Moreover, in some embodiments, the MEMS oscillatory devices may all oscillate in the same direction as shown, for example, in FIGS. 1A and 1C. In contrast, in other embodiments of the present invention, as shown in FIG. 1B, the MEMS oscillatory devices may oscillate in different directions which may also be arranged in a random (non-repeating) manner. Thus, the locations and/or the directions of oscillation of the MEMS oscillatory devices may be equal, patterned and/or random relative to the face 110a, so that any spacing and/or direction is envisioned.

Figure 2:
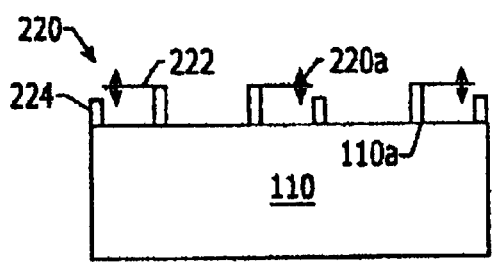
FIG. 2 is a side cross-sectional view of a sensor platform with MEMS fanning components according to still other embodiments of the present invention.

FIG. 2 is a side cross-sectional view of a sensor platform according to other embodiments of the invention. As shown in these embodiments, the MEMS oscillatory devices 220 comprise a plurality of flaps 222 and a plurality of MEMS actuators 224, a respective one of which is configured to oscillate a respective one of the flaps 222. As shown in FIG. 2, the plurality of flaps 222 extend along the face 110a, and the plurality of microelectromechanical actuators 224 are configured to oscillate the plurality of flaps in a direction 220a that is orthogonal to the face 110c. The size and position of the actuators 224 are indicated schematically and may vary depending on the particular actuation mechanism. It also will be understood that in any embodiment of the present invention, the structure of the flaps and actuators may be at least partially combined into an integrated structure.

Figure 3:
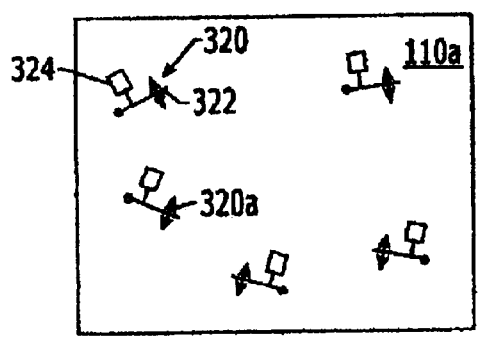
FIG. 3 is a top plan view of a sensor platform with MEMS fanning components according to yet other embodiments of the present invention.

FIG. 3 is a top plan view of a sensor platform according to still other embodiments of the present invention. In these embodiments, the plurality of microelectromechanical oscillatory devices 320 comprise a plurality of blades 322 and a plurality of microelectromechanical actuators 324, a respective one of which is configured to oscillate a respective one of the blades 322. As shown in FIG. 3, in some embodiments, the blades 322 extend along the face 110a and the MEMS actuators 324 are configured to oscillate the blades in a direction 320a that is parallel to the face 110a. As shown in FIG. 3, the blades 322 may oscillate in non-uniform directions 320a that are parallel to the face 110a. In other embodiments, all the blades 322 may oscillate in a same direction that is parallel to the face 110a. It will also be understood that in any embodiments of the present invention, the blades and actuators may be at least partially combined into an integrated structure. Combinations of embodiments of FIGS. 2 and 3 also may be provided. It will also be understood that any of the embodiments of the invention described herein may be used adjacent or on multiple faces of a sensor platform.

It will be understood that many types of conventional MEMS actuators may be used in embodiments of the present invention. The MEMS actuators may be actuated by electrostatic, magnetic, piezoelectric, thermal and/or other conventional MEMS actuation forces. Specific MEMS actuators that may be particularly useful with embodiments of the present invention will now be described in connections with FIGS. 4–11. However, the invention shall not be construed as limited to these embodiments.

Figure 4:
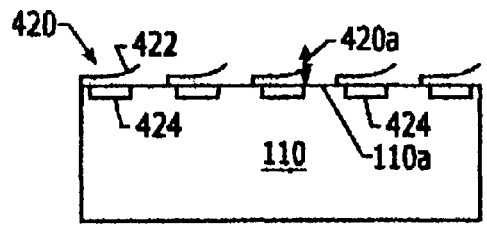
FIGS. 4–8 are side cross-sectional views of a sensor platform with MEMS fanning components according to still other embodiments of the present invention.

In particular, referring to FIGS. 4–8, various embodiments of MEMS oscillatory devices that employ flaps will now be described. In particular, FIG. 4 illustrates a microelectronic substrate 110 having a plurality of flaps 422 that extend along the face 110 and a plurality of MEMS actuators 424 that are configured to oscillate the plurality of flaps in a direction that is orthogonal to the face, as indicated by 420a. As shown in FIG. 4, the MEMS actuators comprise electrostatically actuated flaps. However, other types of actuation also may be provided including, for example, bimorph flaps that are actuated thermally. Shape memory alloy devices also may be used. Other thermally actuated actuators also may be used such as thermal arched beam actuators as described, for example, in U.S. Pat. No. 5,909,078 to Wood et al. and/or thermoelectric actuators as described, for example, in Humbeeck, *Non-Medical Applications of Shape Memory Alloys*, Materials Science and Engineering A, Vol. 273–275, Dec. 15, 199, pp. 134–148.

MEMS structures that may be used to provide MEMS oscillatory devices 420 of FIG. 4 are described in U.S. Pat. No. 6,485,273 to Goodwin-Johansson, entitled *Distributed MEMS Electrostatic Pumping Devices*, the disclosure of which is hereby incorporated herein by reference in its entirety as if set forth fully herein. As described in the Abstract of U.S. Pat. No. 6,485,273, a MEMS pumping device driven by electrostatic forces comprises a substrate having at least one substrate electrode disposed thereon. Affixed to the substrate is a moveable membrane that generally overlies the at least one substrate electrode. The moveable membrane comprises at least one electrode element and a biasing element. The moveable membrane includes a fixed portion attached to the substrate and a distal portion extending from the fixed portion and being moveable with respect to the substrate electrode. A dielectric element is disposed between the at least one substrate electrode and the at least one electrode element of the moveable membrane to provide for electrical isolation. See the Abstract of U.S. Pat. No. 6,485,273. Other MEMS structures that may provide MEMS oscillatory flap devices 420 are described in U.S. Pat. Nos. 6,057,520; 6,229,683; 6,236,491; 6,373,682; 6,396,620; and 6,456,420, all to Goodwin-Johansson, the disclosures of all of which are hereby incorporated herein by reference as if set forth fully herein. The design and operation of MEMS flap actuators are well known to those having skill in the art and need not be described further herein. Moreover, the invention shall not be construed as being limited to the embodiments of MEMS oscillatory flap devices that are described in these patents.

Figure 5:
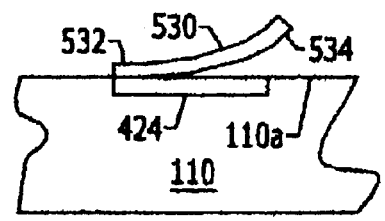
Figure 6:
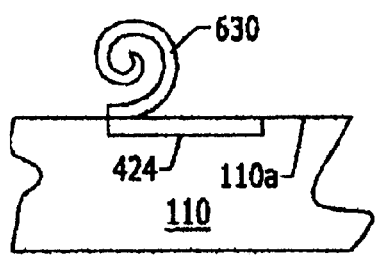
Figure 7:
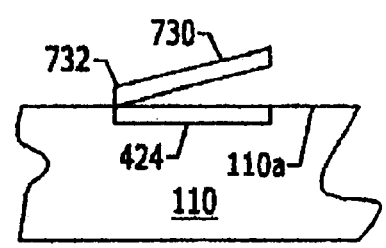
Figure 8:
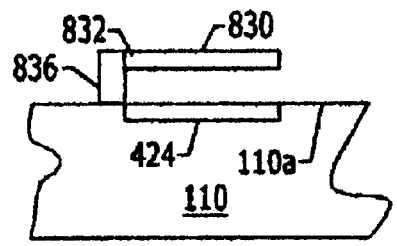

FIG. 5 illustrates other embodiments of MEMS electrostatically actuated flaps that may be used with embodiments of the present invention. As shown in FIG. 5, these flaps comprise a flexible strip 530 including a fixed end 532 and a free end 534 that is opposite the fixed end. An electrostatic actuator 424 is configured to bend the flexible strip 530 to move the free end 534 toward and away from the face 110a in an oscillatory motion. FIG. 6 illustrates a coiled strip 630 that is configured to uncoil and recoil in an oscillatory manner upon actuation of the actuator 424. In other embodiments, a stiff flap may be configured to lift away from the face without much, if any, coiling. FIG. 7 illustrates a rigid strip 730 that is configured to pivot about a fixed end 732 thereof in an oscillatory manner. Finally, FIG. 8 illustrates a cantilevered strip 830, the fixed end 832 of which is spaced apart from the face 110a by a support 836. It will be understood that combinations of the embodiments of FIGS. 4–8 also may be provided. It also will be understood that any of the embodiments of FIGS. 4–8 may be used in an orientation such that the flap(s) extend along the face 110a and oscillate in a direction that also is parallel to the face, similar to embodiments of FIGS. 1A, 1B and 3.

Figure 9A:
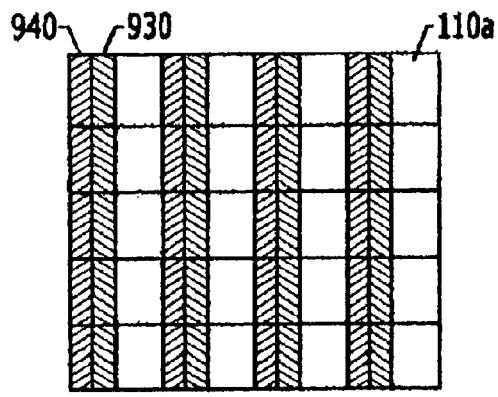
FIGS. 9A–9B and 10A–10B are top plan and side cross-sectional views, respectively, of other sensor platforms with MEMS fanning devices according to other embodiments of the present invention, in unactuated and actuated positions, respectively.
Figure 9B:
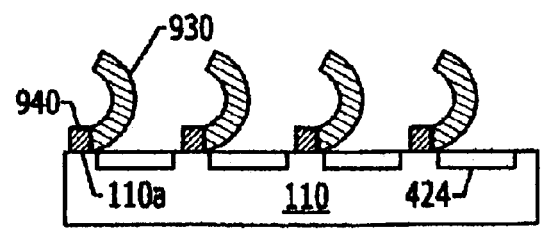
Figure 10A:
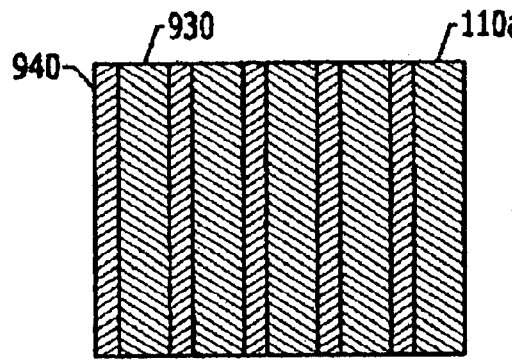
Figure 10B:
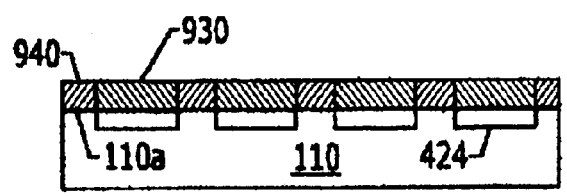

FIGS. 9A–9B and 10A–10B illustrate a specific example of coiled strip MEMS oscillatory devices according to some embodiments of the invention. A 4×4 array is shown, although larger or smaller arrays may be used in other embodiments. FIGS. 9A and 9B are a top plan view and a side cross-sectional views of coiled strip actuators in an unactuated position, wherein the coil strip 930 is anchored to the substrate by an anchor 940 and is coiled in the unactuated position. FIGS. 10A–10B are top plan and side cross-sectional views of these actuators in their actuated positions, wherein electrostatic attraction by the actuators 424 uncoils the coiled strip 930. Microelectromechanical oscillatory devices of these embodiments oscillate between the coiled and uncoiled positions of FIGS. 9A–9B and 10A–10B.

Figure 11:
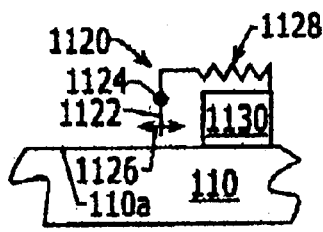
FIG. 11 is a side cross-sectional view of a sensing platform with MEMS fanning devices according to other embodiments of the present invention.
Figure 12:
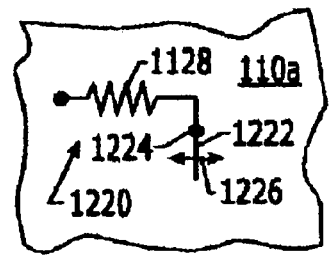
FIG. 12 is a top plan view of a senor platform with MEMS fanning devices according to still other embodiments of the present invention.

FIGS. 11 and 12 illustrate other embodiments of microelectromechanical oscillatory devices that comprise a plurality of blades and a plurality of microelectromechanical actuators, as were generally described in FIG. 3. More specifically, FIG. 11 is a side cross-sectional view of MEMS oscillatory devices 1120 that include a blade 1122 that extends orthogonal to the face 110a and a MEMS actuator 1128 that is configured to oscillate the blade 1122 in a direction 1126 that is parallel to the face. As shown in embodiments of FIG. 11, the blades 1122 may be pivoted about a pivot 1124 and the MEMS actuator 1128 may be supported by a support 1130. FIG. 12 illustrates other embodiments of MEMS oscillatory devices 1220 wherein blades 1222 extend parallel to the face 110a, and are configured to oscillate in a direction 1226 that is parallel to the face 110a. Actuation takes place by a MEMS actuator 1228 that actuates the blades 1222 about a pivot 1224.

In some embodiments of FIGS. 11 and 12, the MEMS actuators 1128 and 1228 may be embodied by integrated force array MEMS actuators. Integrated force array MEMS actuators are described, for example, in U.S. Pat. No. 5,206,557 to Bobbio entitled *Microelectromechanical Transducer and Fabrication Method*, the disclosure of which is hereby incorporated herein by reference in its entirety as if set forth fully herein. As described in the Abstract of U.S. Pat. No. 5,206,557, a microelectromechanical transducer includes a plurality of strips arranged in an array and maintained in a closely spaced relation by a plurality of spacers. An electrically conductive layer on portions of the strips and spacers distributes electrical signal within the transducer to cause adjacent portions of the strips to move together. The strips and spacers may be formed from a common dielectric layer using microelectronic fabrication techniques. See the Abstract of U.S. Pat. No. 5,206,557. Other integrated force array devices are described in U.S. Pat. No. 5,290,400 to Bobbio; U.S. Pat. No. 5,434,464 to Bobbio et al.; and U.S. Pat. No. 5,479,061 to Bobbio et al., the disclosures of all of which are hereby incorporated herein by reference in their entirety as if set forth fully herein. Also see Jacobson, et al., Integrated Force Arrays: *Theory and Modeling of Static Operation*, Journal of Microelectromechanical Systems, Vol. 4, No. 3, September 1995, pp. 139–150, the disclosure of which is hereby incorporated herein by reference in its entirety as if set forth fully herein. The design and operation of integrated force arrays are well known to those having skill in the art and need not be described further herein. It will also be understood that integrated force array structures are not limited to the embodiments shown in these patents.

Microelectromechanical oscillatory devices according to any of the embodiments that were described above in connection with FIGS. 1–12 may be configured to disrupt the boundary layer at a sensor operating zone. In particular, fluid which may contain analyte replaces stagnant fluid, which is removed by a fluid flow adjacent the face. As is well known to those having skill in the art, fluid flow defines a viscous boundary layer adjacent the face. In some embodiments of the present invention, the plurality of microelectromechanical oscillatory devices are configured to oscillate to disrupt the boundary layer. In some embodiments, the plurality of microelectromechanical oscillatory devices are configured to extend at least partially into the boundary layer. In other embodiments, the plurality of microelectromechanical oscillatory devices are located within the boundary layer. Embodiments of the present invention also may be used with sensor platforms other than microelectronic sensor platforms that detect or quantify analyte, in any of the configurations that are described herein.

Figure 13:
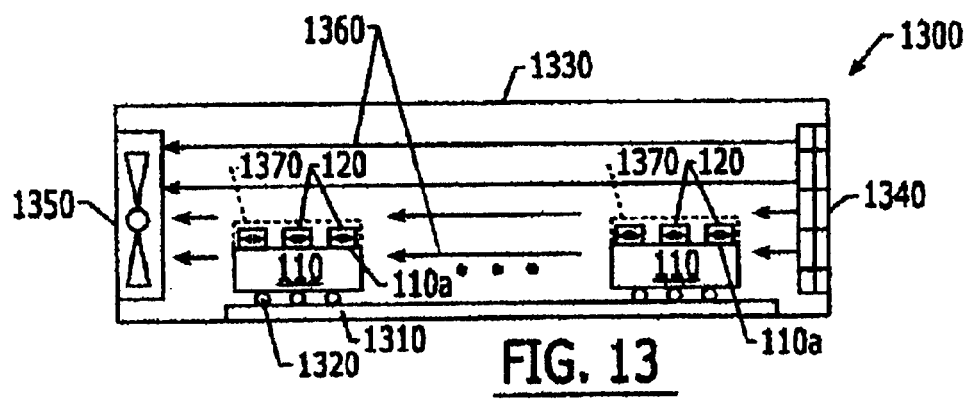
FIG. 13 is a side cross-sectional view of a conduit including sensing components with fanning devices according to other embodiments of the present invention.

More specifically, FIG. 13 is a schematic diagram of a section of a conduit, which includes therein a plurality of microelectronic substrates 110. The microelectronic substrates 110 may be mounted to a second level package 1310 such as a printed circuit board using conventional mounting techniques such as solder bumps 1320. The microelectronic devices 110 are contained within a conduit 1330. The conduit may be cylindrical, rectangular or of a variety of other shapes. The conduit includes a fluid inlet port, such as an air inlet port 1340, and a main fanning system 1350 (shown here as a rotary fan) that together create a fluid flow 1360 across the faces 110a. The fluid flow 1360 defines a boundary layer 1370 of stagnant fluid, such as stagnant air, adjacent the faces 110a. The plurality of MEMS oscillatory devices 120 are configured to disrupt the boundary layer 1370.

Without wishing to be bound by any theory of operation, it has been theorized, according to some embodiments of the present invention, that a major contributor to the inability to increase analyte transport to the operating zone of a sensor is the boundary layer 1370 adjacent the face of the operating zone, which contains stagnant (unmoving) fluid. In contrast, in the fluid flow 1360, analyte transport occurs mainly by convection. Some embodiments of the invention provide MEMS oscillatory devices that extend adjacent and/or at least partially into the boundary layer 1370, to thereby disrupt the boundary layer 1370. An increased amount of analyte transport to the operating zone of the sensor may thereby occur via convection. Since the boundary layer 1370 may only need to be disrupted, MEMS oscillatory devices may be used rather than rotary devices such as MEMS fans. As is well known to those having skill in the art, MEMS rotary devices may be unreliable and may fail relatively quickly. In contrast, MEMS oscillatory devices may have much longer reliability and lifetimes.

In any of the above-described embodiments, the plurality of MEMS oscillatory devices may be powered and/or controlled directly from the microelectronic substrate 110. Thus, the substrate 110 may be configured to change the timing, number, frequency and/or other parameters of the MEMS oscillatory devices to optimize analyte detection, and may also be configured to activate and/or shut down some or all of the MEMS oscillatory devices as a function of analyte that is measured and/or other parameters such as duty cycle or load on the devices in the substrate. However, it will be understood that, in other embodiments, external power and/or control for the MEMS oscillatory devices may be provided.

It will be understood that other embodiments of the present invention can use any electromechanical device that is configured to disrupt the boundary layer by movement thereof MEMS devices, non-MEMS devices, rotary devices and/or oscillatory devices may be provided that are configured to disrupt the thermal boundary layer, to thereby allow increased analyte transport to the operating zone of a sensor. In some embodiments, these electromechanical devices are configured to sweep the boundary layer in a direction that is parallel to the face. The electromechanical devices may be oriented in any of the orientations that are described herein and/or other orientations.

Thus, embodiments of the present invention may be used with microelectronic sensor devices including electrochemical, surface adsorption, molecular recognition or affinity devices, and/or optoelectronic sensor devices, and may also be used with other sensor devices that are not microelectronic devices. Moreover, MEMS oscillatory devices may be used in some embodiments, whereas conventional non-MEMS oscillatory devices may be used in other embodiments. In still other embodiments, other microelectromechanical or electromechanical devices that are configured to disrupt the boundary layer by movement thereof may be used. Embodiments of the present invention also may provide sensor enhancement devices for microelectronic substrate-based sensors or other sensor components, wherein the sensor enhancement devices comprise MEMS oscillatory microconvection devices, non-MEMS oscillatory convection devices, MEMS devices that disrupt the boundary layer and/or non-MEMS electromechanical devices that disrupt the boundary layer. Methods of manufacturing microelectronic sensor devices and/or other sensor devices, and methods of enhancing these devices also may be provided according to embodiments of the present invention.

Additional theoretical discussions of some embodiments of the present invention now will be provided. These theoretical discussions shall not be construed as limiting the present invention.

Some embodiments of the present invention use an approach to sensor enhancement, and sensor improvement generally, employing microfabricated actuators. Some embodiments make use of boundary layer disruption. A boundary layer may be defined as a thin region near a solid object within a moving fluid (gas or liquid) where viscous effects are important. That is, as a fluid moves past a solid object, some of this fluid, located at a great distance from the solid object, behaves as if the object were not there. In contrast, fluid located close to the object interacts with the surface of the object, adhering to it, and at the immediate surface the velocity of the fluid is essentially no different than that of the surface, typically zero for an electronic component or sensor that is not moving. Adjacent to this fluid, other fluid is coupled mechanically to the distant but freely moving fluid through the boundary layer via viscous effects. The thickness of the boundary layer is sometimes determined as the distance from the surface at which the flowing fluid reaches 99% of its "free stream" velocity.

Boundary layers are typically modest in thickness, but they can also be relatively large. For example, the boundary layer for a 5-meter long automobile traveling 120 km/hr in still air may be about 8 cm. The boundary layer for a 40-meter long submarine traveling 70 km/hr in water (higher viscosity than air) may be about 48 cm. For an object, the surface of which is parallel to the direction of fluid flow, the boundary layer at the object's trailing edge may be greater than at the leading edge. For stationary or very slowly moving objects, or slowly moving fluid streams, the boundary layer may be fully established. During acceleration or deceleration of flow, there may be non-steady state effects, adding a temporal component and further complexity to the boundary layer. Superimposed on this could be non-steady state concentration effects resulting from a sudden release or burst of analyte from one or more sources. However, even during steady state, there may be pressure gradients (pressure as a function of distance from the solid surface) as well as thermal gradients (temperature as a function of distance from the solid surface) that may appear quite different from each other. If one knows the temperature of the surface and of a known fluid moving at a defined velocity and other dimensions, a viscous boundary layer may be designated and measured.

A mathematical definition of a boundary layer may depend upon many different parameters. However, for a flat plate with incompressible flow, a viscous boundary layer thickness may be given approximately by:

$$d/x = 5[Re]^{-1/2}. \qquad (1)$$

Stated in words, the ratio of viscous boundary layer thickness d to the distance from the leading edge of a flat plate in a flowing fluid stream x is equal to about 5 times the reciprocal of the square root of the Reynolds number at point x. The Reynolds number is dimensionless and is the ratio of inertial to viscous forces in a moving fluid. The Reynolds number in a circular pipe with fluid flowing may be given by:

$$Re = Dvp/u, \qquad (2)$$

where: Re=Reynolds number;
D=internal diameter of pipe;
v=mean velocity of fluid;
p=density of fluid; and
u=viscosity of fluid.

The viscous boundary layer is characterized by shear and velocity gradients. In contrast, the concentration boundary layer, or "unstirred layer" is characterized by concentration gradients and diffusion. The concentration (or "mass diffusion") boundary layer is typically the same as the viscous boundary layer, for well-mixed samples or milieu entering the general vicinity of the sensor and may be superimposed therewith. However, this may not be true in all cases. For isothermal mass transfer, the Schmidt number (Sc) plays a role analogous to that of Prandtl number in heat transfer and may be used to determine how closely the concentration boundary layer corresponds with the viscous boundary layer, as shown in Equation (3):

$$Sc = u/pDab, \qquad (3)$$

where: Sc=Schmidt number;
u=viscosity of the fluid;
p=density of the fluid; and
Dab=the diffusion coefficient for the diffusion of traces "a" through "b".

The concentration boundary layer is thicker and extends further above the surface of the flat plate than the viscous boundary layer line for fluids where Sc is very low (typically much less than 1.0). The concentration boundary layer is thinner than the viscous boundary layer and does not extend as far above the surface of the flat plate for fluids where Sc is very high (typically much greater than 1.0). Additional discussion of viscous and concentration boundary layers may be found in standard textbooks that describe fluid dynamics, and need not be provided herein.

Transport of analyte in the immediate vicinity of the operating zone or "surface" of a sensor occurs via diffusion. The "layers" of fluid in the vicinity of the surface tend to "insulate" the surface from other layers that may contain other (e.g. higher) concentrations of analyte. Thus, the boundary layer may limit analyte transport, since diffusion, especially in most fluids, is a slower process for analyte transport than convection; so the boundary layer may result in longer times to detect changes in analyte concentration, as well as resulting in possible attenuation of the concentration signals. Some embodiments of the present invention can increase convection by dispersing the layers nearest to the surface and generally disrupting the boundary layer such that a greater amount of analyte may be transported to or from the surface by convection, and therefore the detection time and capability may be improved.

It has been long known in the art of fluid dynamics technology that improved transport of dissolved molecules to or from a sensor surface occurs in turbulent flow relative to the case of laminar flow. Since boundary layers near a wall are thinner in turbulent flow than in laminar flow, all other variables being equal, the diffusion distance is less. An analyte is generally transported through the laminar layers by diffusion (or Brownian motion, in the case of suspended particulate analytes), which calls for a steep concentration gradient near a surface in many fluids because of low diffusivity. Embodiments of the present invention can achieve at least some boundary layer disruption and degradation of laminar layers, and thus can improve analyte transport to a sensor operating zone situated on the face or surface of a sensor.

In some embodiments, boundary layer disruption is brought about via oscillation of one or more blades or flaps sweeping within the boundary layer, using an appropriate actuator. A MEMS actuator may be most appropriate for powering blades or flaps of the type described herein, especially when a macroscopic driver, e.g. an electric motor would not be suitable because of space limitations and/or heat production issues. A variety of MEMS actuators may be employed, but some embodiments use a MEMS actuator of the contractile electrostatic type, also referred to as an integrated force array, to power a tiny blade in the vicinity of the sensor operating zone. A discussion of the configuration and deployment of this type of actuator for this application, according to some embodiments of the present invention, now will be provided.

The use of an appropriate MEMS actuation scheme to disrupt the boundary layer need not contribute measurably to heat production via its action and can maintain relatively isothermal conditions. In contrast, the boundary layer could be disrupted using ultrasound of the appropriate frequency coupled into the fluid to produce cavitation. The use of ultrasonic energy can disrupt the boundary layer but may also generate considerable heat. Unwanted heat may change sensor operating characteristics. Moreover, the oscillatory MEMS actuators used in some embodiments of the present invention, unlike rotating and sliding MEMS systems, may not produce measurable friction and may not wear down due to frictional forces. Ordinary frictional forces may scale to enormous proportions in the micro world and may wreak havoc upon rotary devices such as tiny MEMS fans, turbines, and rotors.

Embodiments of the present invention may be used in conjunction with other sensor enhancement methods, such as concentration systems employing filters or membranes, centrifugal concentrators, electrostatic concentration devices, and other sensor enhancement methods and systems.

Figure 14A:
Figure 14B:

The sensor geometry may be used for enhancement of sensor function: that is, increased sensitivity to analyte and/or increased response time to an external pulse, burst, or other precipitous increase (or decrease) in analyte concentration, Conventional sensors often employ a surface which forms part of a transducer or upon which an appropriate transducer is located. The transducer responds to analyte, typically providing an electronic signal upon the arrival of sufficient analyte at the sensor operating zone to provide a response that is measurable above background noise and interferences or that exceeds a certain detection threshold. It should be understood that for alternative sensor geometries, there still may exist a sensor face (with one or more associated operating zones) as with planar sensors. Such alternative, non-planar, geometries often do not readily lend themselves to the attachment or mounting of electromechanical devices. These alternative sensor geometries will often work best with separate electromechanical devices or oscillatory devices, either with or without conduits, as will be seen. In addition to planar geometries, sensors may be configured as cylinders, shown in FIGS. 14A–14C or as plates FIGS. 14D–F. In FIG. 14A, a smooth walled cylinder is shown. FIG. 14B depicts a smooth walled cylinder covered with projections, with each projection essentially cylindrical (or spike-like) and containing sensing elements. Alternatively, the projections may be passive and the sensing elements situated on the surface between the bases of the projections. If projections are present, surface area will be correspondingly increased. In addition, surface projections facilitate greater mixing in unsteady (pulsating) flow, even at very low Reynolds numbers. In some embodiments, the projections may be minimally 5 to 20 microns in diameter, up to 100 microns long or longer, and spaced 25 to 100 microns apart.

Figure 14C:

FIG. 14C shows a cylindrical porous sensing element with a screen-like outer wall. Surface projections in the sensor geometry of FIG. 14B and the screen-like outer wall of FIG. 14C tend to provide mixing at the boundary layer during flow. FIG. 14D illustrates a different sensing element configuration with operating zones of relatively large surface area, where the sensing elements include flat, flexible sheets supported such that they are arranged in a parallel conformation. In a preferred embodiment for sensing airborne species, the rectangular sheet-like sensing elements are fastened, bonded or otherwise held together at one end, e.g. the bottom end at a fixed distance of approximately 100 microns, such that the other end of the stack is free to move and elements at the top end free to spread further apart in flow (during convection). The flexible rectangular elements may be considerably longer for a given width (greater aspect ratio) than herein depicted. FIG. 14E shows a top view of the elements in a parallel conformation, spaced accordingly. In this figure, a flow condition is present, and the convective forces, shown as arrows at the left (short pulses or "puffs" that may generate eddies) may push apart the elements near the top of the conformation, enabling more fluid to pass through and replace the previous volume of fluid. Alternatively, a continuous flow may, via the Bernoulli principal, push the elements closer together. In either case, some fluid initially residing between adjacent elements will be expelled, and fresh fluid will enter. FIG. 14F shows a microelectronic sensor platform that can be micromachined from a material such as polyimide, including a frame 1400 on which planar sensors 1401 are mounted via torsion hinges 1402 (the torsion hinges containing electrical leads, not shown). The sensors may be deflected with increased flow velocity and twist on their hinges thereby increasing the size of the opening between the edges of neighboring planar sensors and thus allowing increased flow and greater amounts of fluid to pass through the openings. If the planar sensors are spaced accordingly to be used in air for detection of airborne analyte, the typical spacing in some embodiments would be of the order of 100 microns. The use of two or more frames is also possible, whereby the frames are mounted one in front of the other. Between each pulse of flow, this embodiment may allow entrapment of greater amounts of fresh fluid in the vicinity of the sensor faces for diffusion of analyte to the operating zones to occur. The orientation of adjacent frames may also be orthogonal. FIG. 14G shows a top view of twin sensors, 1403 and 1404, each with a cylindrical shape of the type shown in 14A–14C. Also shown are twin fanning devices. The sensors 1403 and 1404 are situated downstream from the fluid flow produced by forward motion of the twin wing-like micro-blades 1405 and 1406, which will be referred to as wings. The dotted lines are the respective forward positions 1405a and 1406a and backward positions 1405b and 1406b, for wings 1405 and 1406. The respective pivot points 1407 and 1408 are also shown. The actuator and drive system could be similar to that depicted in FIGS. 15A–15B or could be of a different type. An asymmetrical driving waveform can be used to drive the wings, such that the wings are driven forward (toward the sensors) rapidly and backward slowly, creating a net forward pulsating flow. It is within the scope of this invention for the wings to approach each other in the forward position so as to essentially make contact. In another embodiment, not shown, the wings can undergo rotation, as wings of many insects do. In such an embodiment, the wings would rotate 90 degrees just prior to the backstroke and reorient just prior to the forward stroke. The rotation of a wing could be achieved by the use of two actuators and their respective torsion hinges configured for movement of a platform, to which the wing is mounted, in orthogonal directions. FIG. 14H shows a side view of the sensors 1403 and 1404, along with micro-blades 1405 and 1406. Although FIGS. 14G and 14H show cylindrical sensors with smooth faces, other sensor geometries could be used: such as those shown in FIGS. 14B, 14C, 14D and 14F as well as additional sensor geometries, not shown.

Figure 15A:
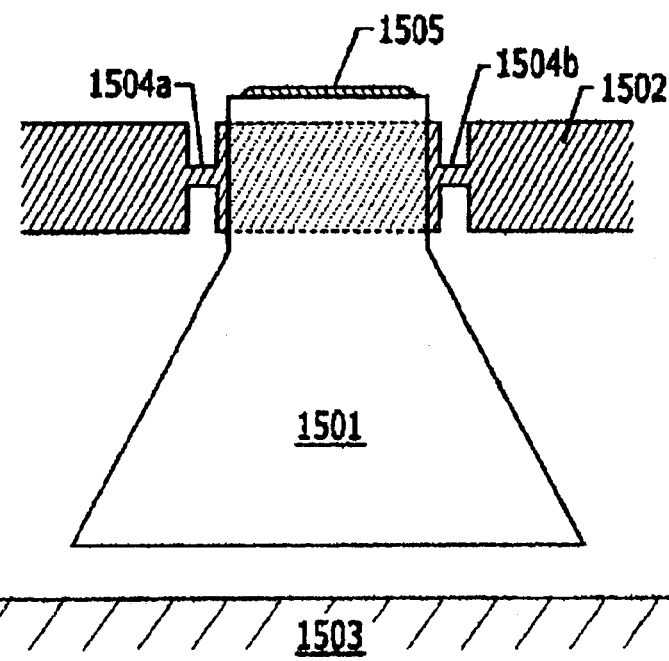
FIGS. 15A–15B are front and side views, respectively, of microelectromechanical oscillatory devices according to some embodiments of the present invention.
Figure 15B:
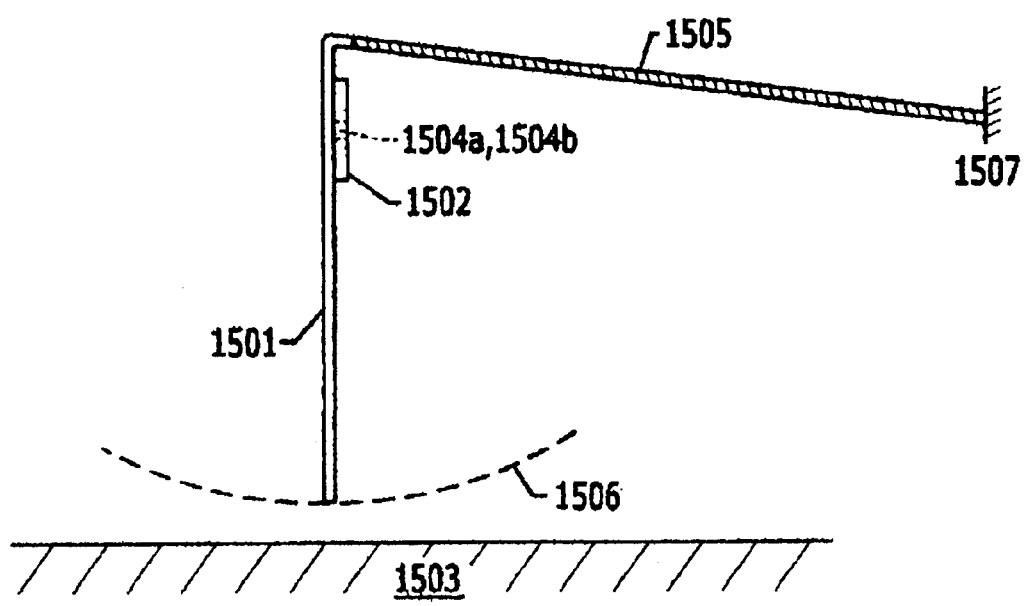

Other embodiments of the present invention that provide oscillating blades, also referred to herein as micro-blades, as were generally described in FIGS. 3, 11 and 12, will now be described. FIGS. 15A and 15B shows a micro-blade 1501 supported by a frame 1502 as part of a system in close proximity to the sensor face or surface 1503 of an electronic component used for sensing (e.g., an affinity sensor) in a fluid environment. FIG. 15A is a front view and FIG. 15B is a side view. Boundary layer disruption is desired for the electronic sensor via mixing at its surface 1503. These embodiments of the micro-blade system include a thin micro-blade 1501 in the shape of trapezoid with a rectangular extension at the smaller trapezoid base. The rectangular section of the micro-blade 1501 is bonded to a platform, most of which is shown hidden in FIG. 15A behind the rectangular section of the micro-blade. Alternatively, the micro-blade could be formed as an extension of the platform itself The platform is part of the frame 1502 and able to swing freely via torsion hinges 1504a and 1504b, which are also part of the frame 1502 in this embodiment. The platform and the micro-blade attached thereto are driven into oscillation by an electrostatic actuator 1505. This actuator acts as an energized spring, alternatively compressing and relaxing as potential is applied from a voltage source (not shown) at a predetermined frequency. The frequency may be chosen to drive the micro-blade system at a resonance point to provide the greatest angular displacement of the blade as it waves back and forth.

In FIG. 15B, the micro-blade system is shown in side view, enabling the actuator to be shown in perspective (but not necessarily to scale) along with the micro-blade 1501, the frame 1502 with torsion hinges (1504a, 1504b), the surface 1503, and a stationary support 1507 that is fixed in position relative to the sensor face 1503. The stationary support 1507 need not be attached to the sensor face 1503 or to the electronic sensor platform. Also shown in FIG. 15B is the arc 1506 swept out by the leading edge of the oscillating micro-blade 1501. Thus, in FIGS. 15A and 15B, the blade 1501 extends generally orthogonal to the surface 1503 and oscillates in a direction 1506 that is generally parallel to the surface 1503.

Figure 16A:
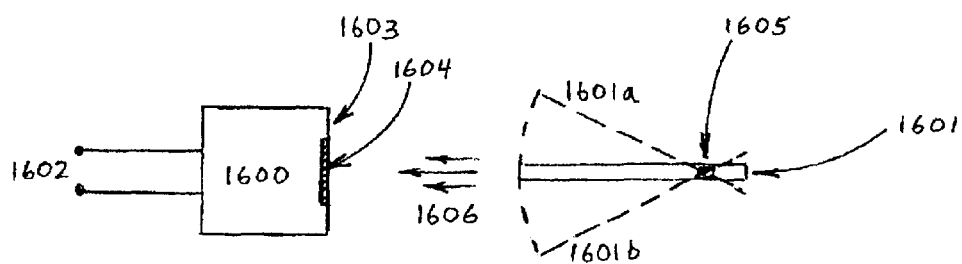
FIGS. 16A–16B are side cross-sectional views of sensors and microelectromechanical oscillatory devices according to still other embodiments of the present invention.
Figure 16B:
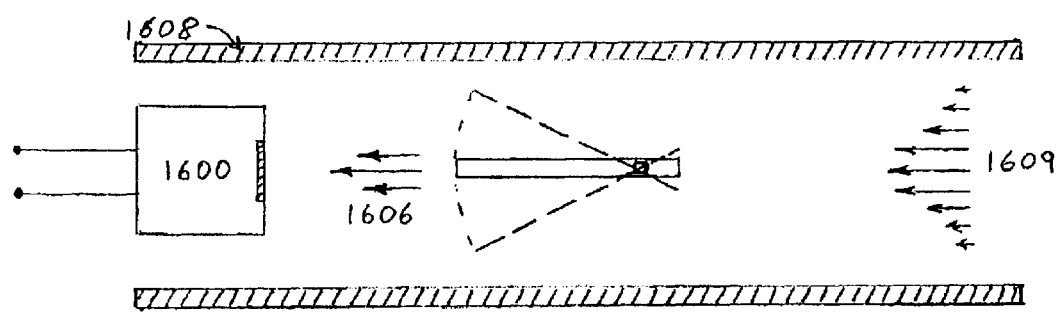

FIGS. 16A–16B show embodiments in which a micro-blade (or a larger oscillating blade) 1601, oscillating about pivot point 1605, as shown by the dotted lines, is oriented to provide pulsating flow directly onto an electronic sensor component 1600 with electrical leads 1602 and a surface 1603 with an operating zone 1604. In this embodiment, the oscillating blade is situated at a greater distance from the sensor than in previous embodiments. The location of the oscillating blade may be outside of the boundary layer with respect to the sensor face. In this embodiment, however, the fanning action may still disrupt the boundary layer from a distance, but a primary desired effect is the generation of a highly-directed pulsating or intermittent flow. This time varying flow (arrows 1606) is useful in improving transport of analyte located some distance away to the sensor operating zone and may provide a transport phenomenon analogous to "sniffing" as previously discussed. FIG. 16A shows a side cross-sectional view of a sensor component 1600 with an active surface 1603, an operating zone 1604, and electrical leads 1602. Micro-blade 1601 is moving in an oscillatory fanning motion, shown bounded by its extremes of displacement, 1601a and 1601b. Pulsating flow directed toward the sensor is indicated by arrows 1606. The micro-blade 1601, as shown, may consist of an arrangement using an electrostatic actuator such as that depicted in FIGS. 15A–15B or could consist of a piezoelectric actuator bonded to a passive, stiff but bendable material to improve displacement at the tip. The use of other types of actuators or oscillatory devices to achieve a fanning effect is also possible, for example: the aforementioned technology of Goodwin-Johansson. FIG. 16B shows a side cross-sectional view of a similar arrangement within a rectangular conduit 1608 that is open at both ends. The cross-sectional area of the conduit in the vicinity of the micro-blade should be somewhat greater than that swept out by during the extremes of motion of the micro-blade to prevent the micro-blade from touching the conduit wall while allowing for as little excess area as possible to maximize forward flow. The forward flow is indicated by arrows 1606. Fluid entering the conduit is shown as arrows 1609. The actual position of micro-blade 1601 may also be much closer to one end of the conduit or the other and need not necessarily be at the midpoint. Sensor 1600 is shown inside of the conduit and in close proximity to the downstream end of the conduit. The sensor may also be situated outside of the conduit and in close proximity to the downstream end of the conduit.

In some embodiments, a greater disruption of the boundary layer may be desired. If one blade is insufficient to achieve the desired effect, a plurality of blades may be used, driven by the same actuator and/or by independent actuators.

Figure 17A:
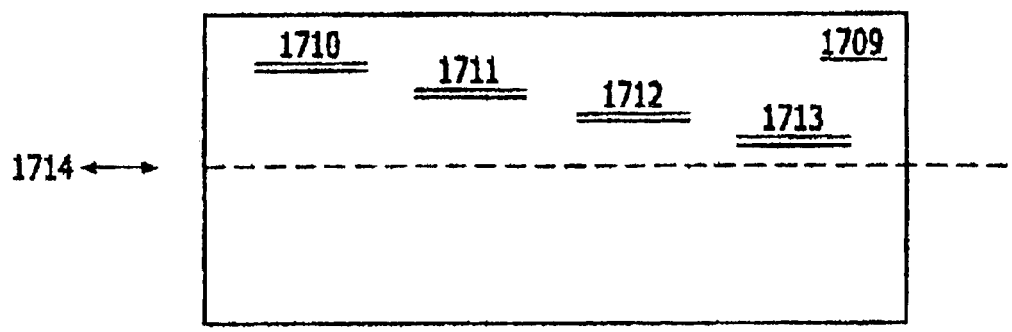
FIGS. 17A–17C are top plan views of microelectromechanical oscillatory devices during operation according to some embodiments of the present invention.
Figure 17B:
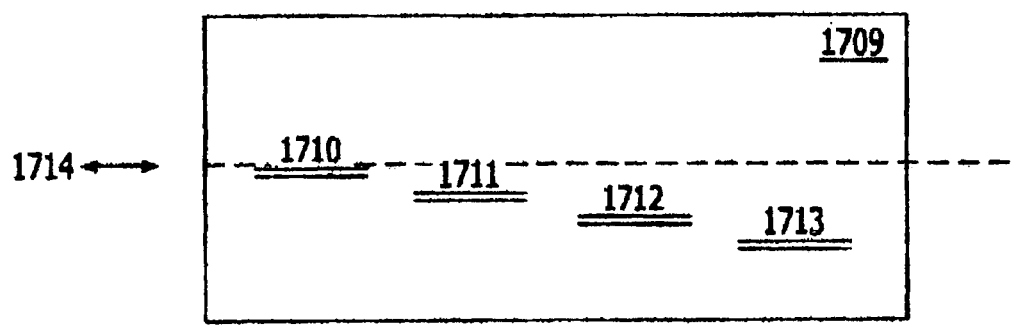
Figure 17C:
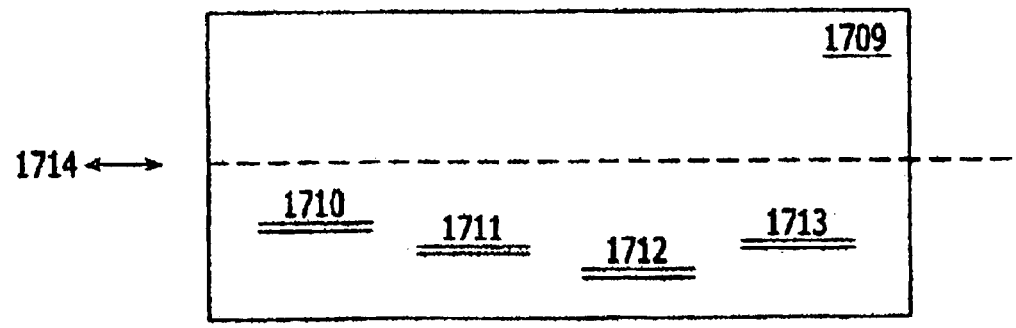

FIGS. 17A–17C show a top view of an embodiment of a micro-blade system including four blades 1710–1713, each mounted to independently swinging platforms (not shown) supported by a common frame (not shown). In FIGS. 17A–17C, only the blade edge closest to the surface of the sensor 1709 is shown for each micro-blade in cross section above the outline of the sensor 1709. The fans 1710–1713 are driven via their respective platforms by independent actuators (not shown). The actuators may be energized by asynchronous sets of waveforms, such that they are driven to a greater or lesser degree out of phase with each other.

Using an actuation scheme of this type, each micro-blade edge, as it is driven back and forth along its arc of travel, sweeps to either side of an imaginary reference line 1714 extending longitudinally across the surface of the sensor 1709. Each micro-blade therefore sweeps fluid laterally to either side of the reference line. The phase relationship of the blades enables a net transfer of fluid longitudinally along the direction of the reference line 1714, as well. Thus, the boundary layer is disrupted laterally and longitudinally as the micro-blades follow a wave-like propagation path.

This motion is brought out in the sequence of events, starting with FIG. 17A, where the micro-blades can be seen above the reference line 1714 and moving toward it. In FIG. 17A, the first micro-blade 1710 is at the extreme end of its arc of travel. In FIG. 17B, a very short time later, the micro-blades have advanced to new positions, having crossed the reference line 1714, and are now moving past and away from the reference line. The first micro-blade 1710 has just crossed reference line 1714, and the other micro-blades are well past it. In FIG. 17C, the first micro-blade 1710 is well past reference line 1714. The second micro-blade 1711 is approaching the end of its arc. The third micro-blade 1712 is at the end of its arc, and the fourth micro-blade 1713 has completed its arc, reversed direction, and is now moving toward the reference line 1714.

Figure 18:
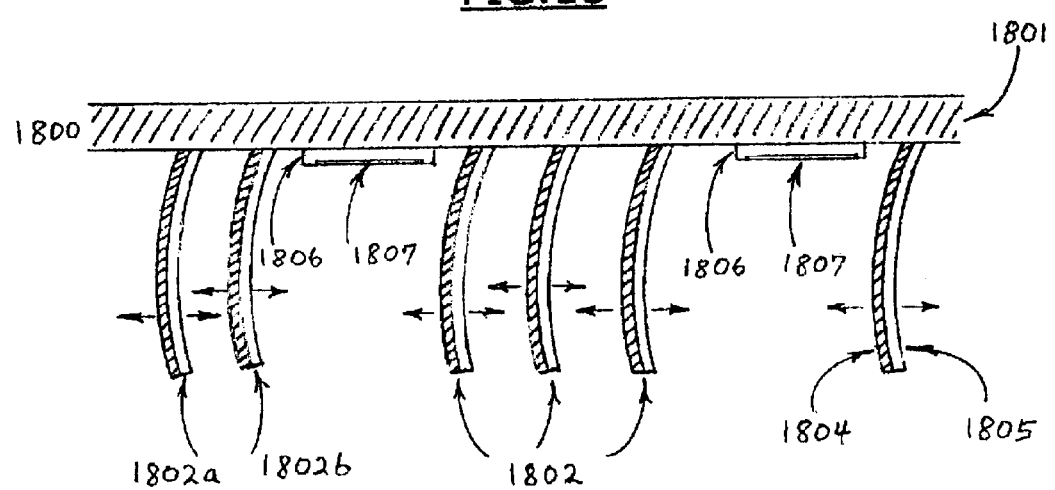
FIG. 18 shows microelectromechanical systems enabling cilia-like motion for transport of substances to sensors to improve detection capability.

FIG. 18 shows a MEMS application platform 1800 enabling cilia-like motion to transport molecules and/or particles in a fluid to the operating zone 1807 (or zones) of a sensor 1806 (or sensors) that are integrated into the structure or closely apposed to or associated with the MEMS components. The "cilia" 1802 are attached at one end to a substrate 1801, which substrate may be made of silicon, glass, polyimide, or other suitable materials. The cilia could be bimorph in structure, where cilia 1802 consist of two piezoelectric materials of opposite polarity, 1804 and 1805, bonded together. Alternatively, the bimorph could consist of a piezoelectric material bonded to a passive stiff, but bendable material. Material 1805 may then be a thicker sheet of plain polyimide. Other actuator types may also be possible to produce the appropriate cilia-like response, that is: a coordinated movement. For example, softer, more flexible cilia could be fabricated using the electrostatic actuator of Jacobson, et. al. (fabricated from metallized polyimide as material 1804). The cilia could also be structured along the lines of an electrostatic flap-type device, such as that taught by Goodwin-Johansson. In either case, application of voltage causes the cilium to flap or to bend. The appropriate operating voltages may be applied to individual cilium or groups of cilia to cause contraction of material 1804 and hence bending of selected cilia among 1802, e.g. 1802*a* and/or 1802*b*, etc. Cessation of applied voltage would induce relaxation of the cilium and return to its resting shape. Electrical leads may be patterned on the surface of substrate 1801 and connected to the actuators to allow actuation signals to travel to an individual cilium in a timed sequence to produce a coordinated movement, capable of transporting fluid in one direction along with molecules or particles of interest. In the embodiment shown in FIG. 18, sensors 1806 with operating zones 1807 are microfabricated on substrate 1801. The movement of the cilia exposes the operating zone of the sensor to more molecules (and/or particles) of interest, thus enhancing detection. The cilia may also be constructed such that the sensor elements are integrated onto one side of each cilium to increase exposure of the species of interest to available sensors. Yet another embodiment of the system may utilize sensors downstream and closely associated with the substrate containing attached cilia. In this embodiment, the cilia act in concert to move species of interest toward the operating zone of the sensor.

Whereas sensors in FIG. 18 may be situated on a fixed substrate to which moveable cilia are attached or at a separate location close by, as has been mentioned, sensors may also be incorporated into the cilia themselves. Similarly, sensors may be located on wings, blades, flaps, or fans themselves. In such cases, the sensor and its electrical leads electrical leads would be fabricated into or onto the cilia, wing, blade, or flap structure. Moveable hinge portions, such as torsion hinges, may contain current-carrying leads or coatings for electrical communication with power sources and/or electronic components or systems. For purposes of simplicity, electrical connections and electrical leads to the actuators are not shown in the previous figures. Details of electrical connections may be found in the aforementioned references for the different types of actuators, as well as in references for actuators that were not specifically mentioned but are usable in the present invention. It is to be understood that various other actuators that might be substituted in any of the diagrams for the ones shown might require correspondingly different electrical connections. It is also to be understood that cilia, wings, blades, and flaps may be fabricated with textures or passive projections to improve mixing of fluid, as will be discussed.

A micro-blade may assume a variety of shapes, depending upon the application. If the micro-blade is to be situated within a confined space, a shorter geometry may be used compared to that of the long trapezoidal fan shape shown in FIGS. 15 and 16. The micro-blade can also have a sector shape, as cut from a circle, or even a square or triangular shape. Many other shapes are possible. The micro-blade may be flexible, to the extent that it deforms slightly as it is driven back and forth, allowing somewhat thinner materials to be used in its fabrication. A micro-blade may also be fabricated from a variety of materials, for example-polyimide, polyester, titanium, carbon, silicon, titanium, iron alloys, carbon nanotube composites and stiffened silks, to name a few.

In some embodiments, the leading edge of the micro-blade is situated close to the sensor surface to enable a greater degree of disruption of the layers of fluid closest to the surface. It is possible to power micro-blades from a distance, for example using a miniature speedometer-type cable connected to a conventional electric motor. However, for small electronic devices, power requirements and overall heat production of an electric motor may be counter productive.

MEMS actuators are very small and can be highly efficient. Therefore a MEMS actuator may be used in many embodiments of the present invention. In general, when a MEMS actuator is used to drive a micro-blade, the micro-blade system may be situated in close proximity to the sensor surface. However, locating the micro-blade itself, or structures associated with it, directly on the sensor surface may create eddies and give rise to stagnant pooling or entrapment of fluid in some embodiments. Such stagnant pooling and/or entrapment of fluid may create local regions of "stagnant flow" and become counterproductive in some embodiments. The location of micro-blades on the surfaces of some sensors may interfere with their function. In addition, the fluid may be driven with an appropriate oscillating frequency. Desirable frequencies may be higher for gases, such as air, and correspondingly lower for liquids in some embodiments, since the viscosities of liquids are much greater. Aside from requiring more driving energy, the use of very high frequencies may result in heating the fluid. In air, frequencies for achievement of sensor enhancement may be expected to be below 5,000 Hz and generally below 500 Hz. It may be expected that frequencies below 50 Hz may be adequate for most applications where air is the fluid.

In an electrostatic-type MEMS flap actuator, of the type described, the fluid medium also may become the dielectric material for the capacitive elements of the actuator. In some embodiments, the actuator may be isolated from the fluid by encasing it in a bladder or similar structure containing a fluid of choice. In such embodiments, the contained fluid may be chosen for its superior dielectric properties.

In some embodiments, the micro-blade or the flap may have a textured surface. The texturing may include a pattern of shapes, e.g. small hexagons raised slightly on both surfaces of the blade. An alternative surface for a blade may include a flat substrate, typically 25 to 100 microns thick with either stiff or flexible needle-like projections (or a combination of both types) on both surfaces. In such a configuration, the needle-like projections of about 5 $\mu$m to about 20 $\mu$m mean diameter and up to about 100 $\mu$m or more long could have a relatively high density and be spaced about 25 $\mu$m to about 100 $\mu$m apart. These projections may be positioned at right angles to the plane of the substrate but may also project at an angle of 30° or perhaps even less. Projections may also be used on the edge of the micro-blade. Such textures and/or projections may increase the ability of the blade to move fluid and break up laminar fluid layers.

The appropriate textures and/or projections may be fabricated by various methodologies known in the art of microfabrication. Such projections or high aspect ratio patterns, in general, may be formed by processes such as: chemical etching, electrodeposition or micromachining via electron beam or laser beam. Alternatively, LIGA [the German acronym for X-ray lithographic (X-ray lithography), galvanoformung (electrodeposition) and abformtechnik (molding)] may be used to provide efficient high volume production. Other possible production methods include self-assembly strategies and a variety of other possible techniques including magnetic orientation of structures prior to hardening with UV-curable or epoxy adhesive. Alternatively, fabrication of suitable textured surfaces may be prepared using adhesive coating of the substrate and aerosol deposition of freely suspended shaped particles on the substrate to create projections or surface structures.

The following Examples shall be regarded as merely illustrative and shall not be construed as limiting the invention.

EXAMPLE 1

This Example used a piezoelectric fan blade, which is a solid state device, consisting of an oscillating Mylar blade driven at resonance by a piezo bending electric element. The particular piezoelectric fan blade is distributed by Piezo Systems, Inc., Cambridge, Mass., and is described for example at piezo.com/rfn1005.html. In this Example, the same configuration as was described in FIG. 16B was used, except that the edge of the blade was situated 3 cm from the downstream end of a 13.5 cm long rectangular conduit (2 cm wide×3.3 cm high) fabricated from 1 mm thick cardboard. The piezoelectric fan-blade provided airflow outward from the downstream end when energized. An ionization sensor obtained form a conventional smoke alarm First Alert Cat. No. HDSA2-QP, BAK Brands, Inc. Aurora, Ill.) was placed outside the conduit and 1 cm from the downstream end of the conduit. The ionization sensor was kept in its protective cage throughout these experiments. Normal operation of the smoke alarm circuitry was verified before and after experiments with the Smoke Check™ smoke alarm tester (Smoke-Automatic Fire Detector Accessory 60S9, Home Safeguard Industries, LLC, Rolling Meadows, Ill.) dispensed via aerosol can. Using a lighted incense stick (Inner Source Incense, Genieco, Inc. Chicago, Ill.) the burning end was placed at a horizontal distance of 1 cm from the ionization sensor cage and resulted in an alarm no sooner than 150 seconds in repeat experiments. When the conduit was placed on a horizontal table near the sensor cage, such that the downstream end of the conduit was 1 cm from the sensor cage, with the fan energized, the placement of the burning incense stick 1 cm from the upstream end of the 13.5 cm long conduit (a total of 15.5 cm from the sensor cage) resulted in an alarm in 5 seconds in repeat experiments, demonstrating improved sensor performance. The fanning frequency was 60 Hz. The width of the piezoelectric fan blade was 12.7 mm. Placing the same incense stick along a vertical line and 2 cm below the ionization cage (everything turned 90 degrees) and allowing "natural convection currents" caused by the heated air to carry smoke into the ionization cage did not result in an alarm sooner than 8 to 12 seconds, even after the ionization cage was observed to fill completely with smoke, which did not occur when the fan and conduit were used.

EXAMPLE 2

A MEMS integrated force actuator of the contractile electrostatic type (integrated force array) described previously was utilized to drive a micro-blade fan fabricated from polyimide, in accordance with the embodiment in FIGS. 15A and 15B. The fan chosen was somewhat longer than that shown in FIGS. 15A–15B and shaped as a trapezoid 8 mm high, with a base of 3.2 mm and a width of 1.6 mm. The fan blade thickness was 76 microns. The fan was affixed to the frame with epoxy resin. The actuator was fabricated from a micromachined polyimide sheet 2.2 microns thick, 3 mm wide and 10 mm long with opposing metallized plates in each micro-cell. Positive and negative triangular pulse trains, out of phase with each other, were used to power the actuator. Opposing plates in the capacitive micro-cells of the actuator were thus supplied continuously with +40 volt and −40 volt pulses, respectively, with the bases of both triangle waves set at zero. It was demonstrated that a back and forth fanning frequency of 42 Hz could be achieved, creating a reciprocating fanning effect. Sensor enhancement data were not collected for this device.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A microelectronic device comprising: a microelectronic analyte sensor including a face; and at least one microelectronic oscillatory fan adjacent the face that is configured to oscillate to provide a local convection source for the sensor.

2. A microelectronic device comprising: a microelectronic analyte sensor including a face, the microelectronic sensor detecting analyte contained in the milieu with a concentration boundary layer generated during operation thereof adjacent the face; and at least one microelectromechanical fan that is configured to disrupt the boundary layer by movement thereof.

3. A method of enhancing the performance of a microelectronic analyte sensor including a face, the method comprising: oscillating a plurality of microelectromechanical oscillatory fans adjacent the face that are configured to effect increased transport of analyte, to be detected by the sensor, to the sensor face during operation thereof.

* * * * *

UNITED STATES PATENT AND TRADEMARK OFFICE
CERTIFICATE OF CORRECTION

PATENT NO.    : 6,849,910 B2
DATED         : February 1, 2005
INVENTOR(S)   : Bruce J. Oberhardt, Stephen W. Smith and Jason Michael Zara It is certified that error appears in the above-identified patent and that said Letters Patent is hereby corrected as shown below:

Column 3,
Lines 24 and 28, the word "pheromone" should read -- pheremone --

Signed and Sealed this

Fourteenth Day of June, 2005

JON W. DUDAS
*Director of the United States Patent and Trademark Office*